United States Patent
Sato et al.

(10) Patent No.: US 6,236,141 B1
(45) Date of Patent: May 22, 2001

(54) SURFACE ACOUSTIC WAVE ELEMENT

(75) Inventors: Hiroki Sato, Moriguchi; Keiji Onishi, Settu; Akihiko Namba, Osaka; Yutaka Taguchi, Takatsuki; Yosihiro Tomita, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/459,107

(22) Filed: Dec. 13, 1999

(30) Foreign Application Priority Data

Dec. 14, 1998 (JP) .................................................. 10-354989

(51) Int. Cl.[7] .................................................. H03H 9/25
(52) U.S. Cl. ...................................... 310/313 R; 310/348
(58) Field of Search ............................... 310/313 R, 348

(56) References Cited

U.S. PATENT DOCUMENTS

| | | | |
|---|---|---|---|
| 5,446,330 | 8/1995 | Eda et al. ........................... | 310/313 R |
| 5,448,126 | * 9/1995 | Eda et al. ........................... | 310/313 A |
| 5,589,724 | * 12/1996 | Satoh et al. ........................... | 310/348 |
| 5,759,753 | 6/1998 | Namba et al. ........................... | 438/456 |
| 5,847,489 | * 12/1998 | Satoh et al. ........................... | 310/348 |

FOREIGN PATENT DOCUMENTS

| | | | |
|---|---|---|---|
| 6-326553 | 11/1994 | (JP) | ................................. H03H/9/25 |
| 9-92895 | 4/1997 | (JP) | ................................. H01L/41/08 |

OTHER PUBLICATIONS

Yamanouchi, Kazuhiko et al. "SAW Properties of SiO$_2$/128°Y–X IiNbO$_3$ Structure Fabricated by Magnetron Sputtering Technique", *IEEE Transactions on Sonics and Ultrasonics*, vol. SU–31, No. 1, Jan. 1984, pp. 51–57.

* cited by examiner

*Primary Examiner*—Thomas M. Dougherty
(74) *Attorney, Agent, or Firm*—Smith, Gambrell & Russell, LLP.

(57) ABSTRACT

Disclosed is a SAW element with a propagation substrate that is a piezoelectric substrate. An auxiliary substrate is laminated on one surface of the propagation substrate by way of direct bonding, and a comb-shaped electrode is formed on another surface of the propagation substrate that is opposite the surface with the auxiliary substrate. The electrode excites an acoustic wave. The propagation substrate and the auxiliary substrate are not bonded to each other in at least a region immediately below a region where the comb-shaped electrode is formed. A coefficient of thermal expansion in a propagation direction of the acoustic wave of the auxiliary substrate is smaller than a coefficient of thermal expansion in a propagation direction of the acoustic wave of the propagation substrate.

10 Claims, 15 Drawing Sheets

SURFACE ACOUSTIC WAVE ELEMENT

BACKGROUND OF THE INVENTION

1. Field of the Invention

The present invention relates to a SAW element, etc. to be used for mobile communication apparatus, etc.

2. Description of the Prior Art

In recent years, higher performance of communication equipment is in progress as a result of evolution and growth of mobile communication technology. These equipment always requires devices such as high-frequency filter and resonator, etc., and these devices are in need of higher performance. Conventionally, SAW elements are in broad use for these devices.

Characteristics of a SAW element are mainly determined by piezoelectric substrate in which surface acoustic waves propagate. What is important as characteristics of a piezoelectric substrate is the electromechanical coupling coefficient and temperature dependency. The electromechanical coupling coefficient is quantity related to pass band width of the filter configured by a SAW element and Q value of the resonance device, and temperature dependency relates to variation quantity of center frequency of the filter for temperature changes, and variation quantity of resonance frequency of the resonance device. In addition, the electromechanical coupling coefficient as well as temperature dependency is intrinsic to material of piezoelectric substrate and the direction of substrate.

The characteristics required for the piezoelectric substrate forming a SAW element are high electromechanical coupling coefficient, for example, so as to secure broad passing band for the high frequency band, and small temperature dependency so as to control frequency variations. However, as for existing piezoelectric substrate, temperature dependency is intensive for those with higher electromechanical coupling coefficient. Therefore, realization of a SAW element with higher electromechanical coupling coefficient and small temperature dependency is regarded as a problem in filter designing.

A PCN system, which is one of mobile communication system, will be described as an example. The PCN system works within a narrow frequency range of 20 MHz for the transmitting frequency band in a high-frequency band and the receiving frequency band. Considering production deviation on elements as well as frequency variation quantity due to temperature changes, in filter designing for a high-frequency band, the frequency range for the transmitting frequency band filter and the receiving frequency band filter will become further narrower.

Accordingly, it will become difficult to secure attenuation in receiving frequency band filter for transmitting band, and attenuation in transmitting frequency band filter for receiving band, or so called interband attenuation. In use of 36° rotated Y cut X propagation lithium tantalate as a piezoelectric substrate, the electromechanical coupling coefficient is 5% and the temperature dependency (temperature coefficient of delay time; TCD) is 35 ppm/° C., and therefore the substantial band width becomes ten and several MHz so that it will not become possible to secure any sufficient interband attenuation. Accordingly, desired is a piezoelectric substrate with around 5% of or more electromechanical coupling coefficient in order to secure a frequency band width, and with TCD of less than 35 ppm/° C. in order to secure interband attenuation.

However, it would not give rise to any problems if there were a piezoelectric substrate with larger electromechanical coupling coefficient, and smaller TCD, but there are not such a substrate among existing substrates. Therefore, a method to reduce TCD in an existing substrate has been proposed.

For example, as shown in IEEE Transactions on Sonics and Ultrasonics, volume SU-31, pp. 51–57 (1984), it is known as a method that a silicon oxide thin film layer with reversed code in that material temperature coefficient is formed on a lithium niobate substrate so as to improve the temperature dependency in propagation characteristics of surface acoustic wave.

However, in the IEEE method, it is necessary to make thickness of the silicon oxide thin film layer extremely thin such as to within a single length of a wave for the wave length of the working SAW at largest in order to attain improved effect on the temperature characteristics. However, it is difficult to make thickness of such thin silicon oxide film layer as well as the film quality thereof homogeneous.

A method to improve temperature characteristics is shown in Japanese Patent Laid-Open No. 6-326553 specification as the one to solve these problems. This method involves a using substrate which has undergone lamination by direct bonding of substrates with respectively different thermal expansion coefficient, wherein, compared with the case with a single substrate, the substantial thermal expansion coefficient of laminated substrates is reduced, and consequently temperature dependency of SAW element is improved.

Conventional SAW element based on the temperature characteristics improvement method shown in Japanese Patent Laid-Open No. 6-326553 will be explained as follows.

FIG. 11 is a sectional view showing a conventional SAW element using a laminated substrate by way of direct bonding. In FIG. 11, a propagation substrate being a piezoelectric substrate is numbered as 31, an auxiliary substrate using low temperature expansion coefficient material is numbered as 32, and comb-shaped electrodes are numbered as 33.

The propagation substrate 31 and the auxiliary substrate 32 are brought into direct bonding. As the propagation substrate 31, lithium tantalate and lithium niobate are used. Normally, thickness of the propagation substrate 31 is not less than five times of the working wave length. Since the thermal expansion coefficients for the propagation substrate 31 and the auxiliary substrate 32 are different, the substantial thermal expansion coefficient of the stuck substrate will be different from the thermal expansion coefficients intrinsic to the respective substrates, and consequently temperature dependency thereof will become different.

However, the conventional SAW element has problems as follows.

A conventional SAW element comprises a propagation substrate and an auxiliary substrate, the both substrates being brought into bonding in the entire surfaces. In this case, it would go well if substrate bonding were complete, but if the substrate bonding is not sufficient, stress to be extended over the surface layer of the propagation substrate will not become homogeneous due to temperature changes. As a result, while the SAW is being transferred on the substrate, the speed of the SAW changes. In addition, in some cases, SAW propagation loss will increase.

BRIEF SUMMARY OF THE INVENTION

Object of the Invention

The object of the present invention is to provide a SAW element showing good temperature characteristics, considering problems that in such a conventional SAW element, bonding intensity of substrates are heterogeneous on the bonding surface which gives rise to dispersion in propagation characteristics of the surface acoustic wave.

Summary of the Invention

A first aspect of the present invention (corresponding to claim 1) is a SAW element comprising:

a propagation substrate being a piezoelectric substrate;

an auxiliary substrate which is laminated on said propagation substrate by way of direct bonding; and a comb-shaped electrode to be formed on a surface of said propagation substrate, the surface of which is the opposite side to the bonding surface with said auxiliary substrate and to excite an the acoustic wave, wherein:

said propagation substrate and said auxiliary substrate are not brought into bonding each other at least in a region immediately below a region where said comb-shaped electrode is formed; and a thermal expansion coefficient in a propagation direction of said acoustic wave of said auxiliary substrate is smaller than a thermal expansion coefficient in a propagation direction of said acoustic wave of said propagation substrate.

A second aspect of the present invention (corresponding to claim 2) is the SAW element according to the first aspect, wherein a concave portion or a groove is formed on said propagation substrate, and existence of said concave portion or groove forms a region where said propagation substrate and said auxiliary substrate are not brought into bonding.

A third aspect of the present invention (corresponding to claim 3) is the SAW element according to the first aspect, wherein a concave portion or a groove is formed on in said auxiliary substrate, and existence of said concave portion or groove forms a region where said propagation substrate and said auxiliary substrate are not brought into bonding.

A fourth aspect of the present invention (corresponding to claim 4) is the SAW element according to the first, second or third aspects, wherein a region where said propagation substrate and said auxiliary substrate are brought into bonding exists covers all of the circumference of said propagation substrate.

A fifth aspect of the present invention (corresponding to claim 5) is the SAW element according to the first aspect, wherein said propagation substrate and said auxiliary substrate are substantially rectangular-shaped, and a region where said substrates are brought into bonding each other exists on two lines of any pair of lines facing each other of said propagation substrate.

A sixth aspect of the present invention (corresponding to claim 6) is the SAW element according to the fifth aspect, wherein said two lines of any pair of lines facing each other are such two lines of a pair in two pairs each having two lines, that receive stress more homogeneously in a surface substantially perpendicular to the propagation direction of said acoustic wave.

A seventh aspect of the present invention (corresponding to claim 7) is the SAW element according to the second or third aspects, wherein said grooves are formed in parallel to a direction of fingers of said comb-shaped electrode.

An eighth aspect of the present invention (corresponding to claim 8) is the SAW element according to the second or third aspects, wherein the thermal expansion coefficient of said propagation substrate has anisotropy, and said grooves are formed in a direction substantially perpendicular to the direction having larger thermal expansion coefficient of said propagation substrate.

A ninth aspect of the present invention (corresponding to claim 9) is the SAW element according to any of the first through eighth aspects, wherein said direct bonding is obtained by flattening, mirror-polishing, cleaning and hydrophilic-performing the respective surfaces of said propagation substrate and said auxiliary substrate and overlapping, the substrates and thereafter making said bonding with thermal processing.

A tenth aspect of the present invention (corresponding to claim 10) is a mobile communication apparatus comprising a SAW element according to any one of the first through ninth aspects, an antenna, a transmitting signal processing circuit, and a receiving signal processing circuit, wherein:

said SAW element is used as a filter or a resonator.

[Description of Symbols]

11, 31 Propagation substrate

12, 32 Auxiliary substrate

13, 33 Comb-shaped electrode

14 Groove

15 Concave portion

DETAILED DESCRIPTION OF THE PREFERRED EMBODIMENTS

Embodiments of the present invention will be described as follows with reference to the drawings.

(First Embodiment)

Firstly, a first embodiment of the present invention will be described with reference to the drawings.

Figure 1:
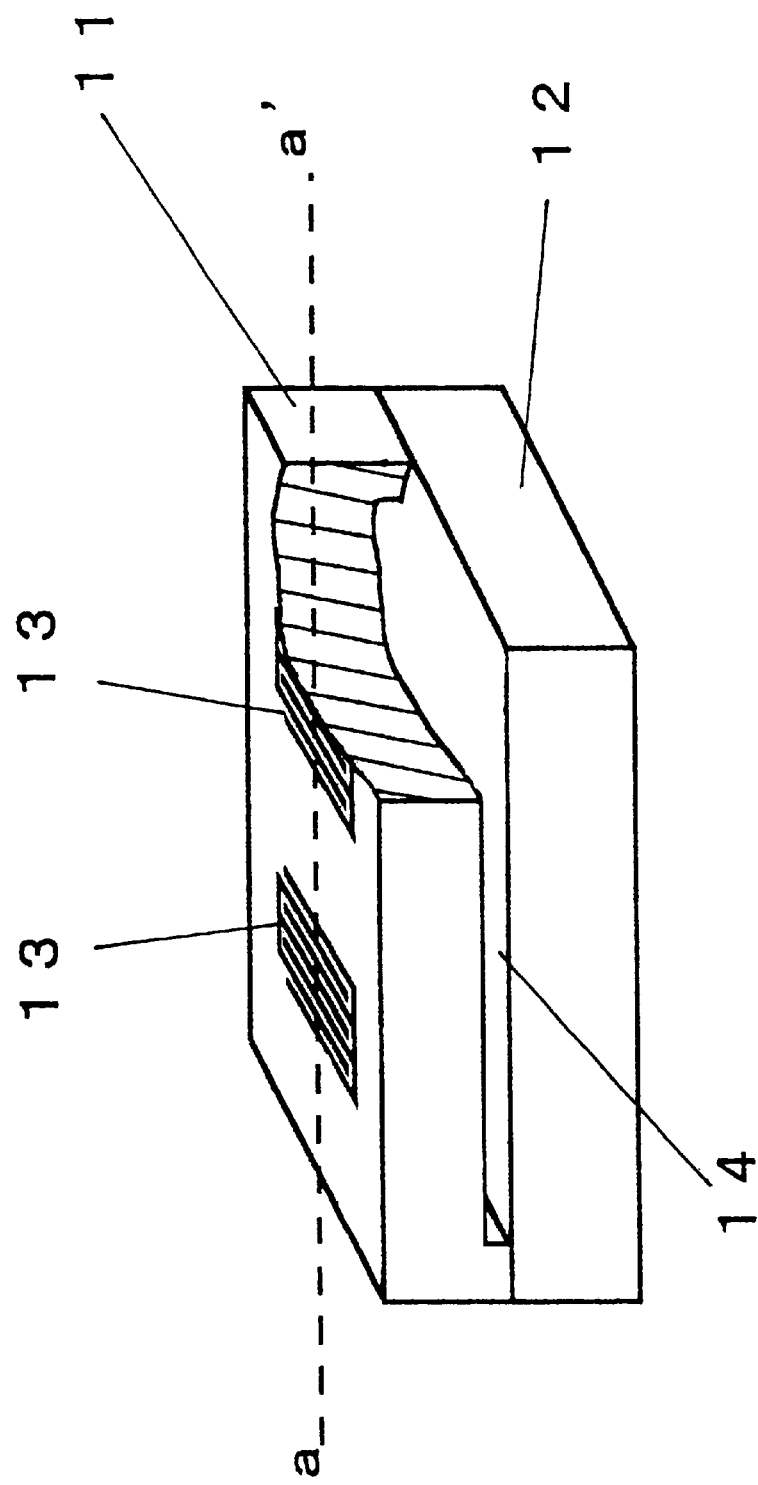
FIG. 1 is a partially broken perspective view of a SAW element in a first embodiment of the present invention.
Figure 2:
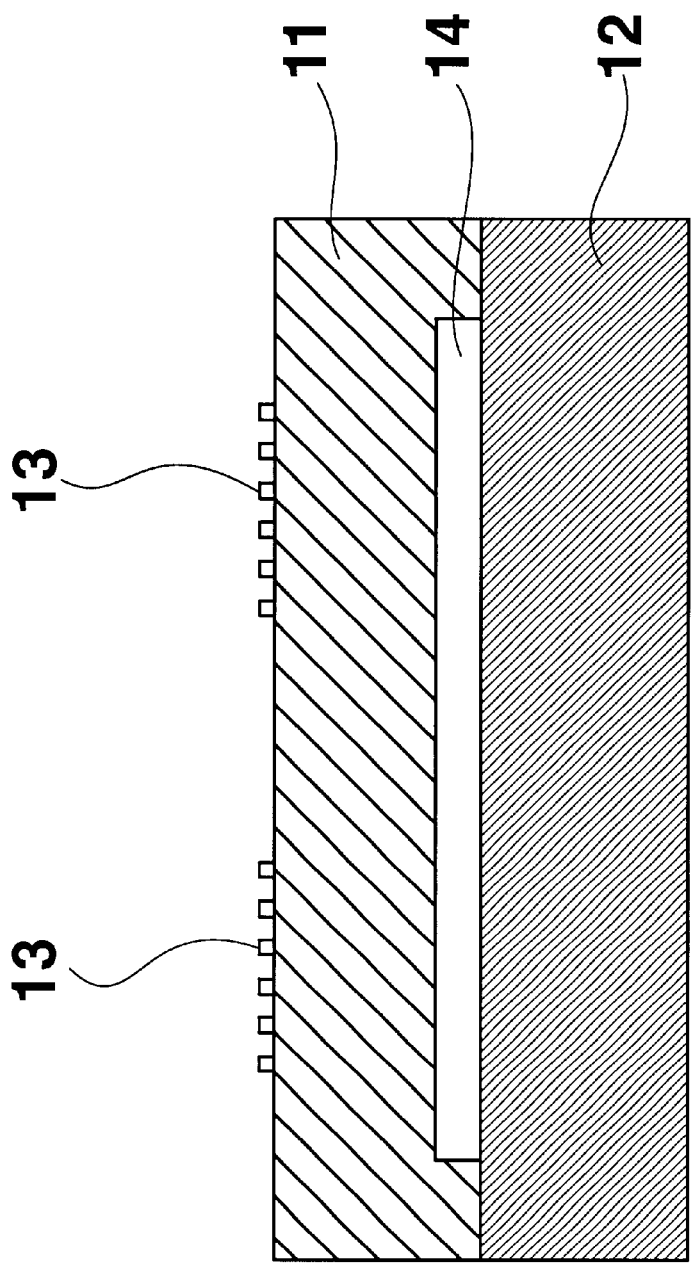
FIG. 2 is a sectional view along a line a—a' in FIG. 1.

FIG. 1 is a partially broken perspective view of a SAW element in the first embodiment of the present invention, and FIG. 2 is a sectional view along a line a—a' in FIG. 1. The SAW element shown in FIG. 1 and FIG. 2 is configured by comprising a square-shaped propagation substrate 11 being a piezoelectric substrate, a square-shaped auxiliary substrate 12, and a comb-shaped electrode 13.

The comb-shaped electrode 13 is formed on the surface of the propagation substrate 11, the surface of which is opposite surface to the bonding surface of the propagation substrate 11 and the auxiliary substrate 12. And on the surface facing the auxiliary substrate 12 of the propagation substrate 11, a groove 14 is formed in the direction substantially parallel along the comb-shaped electrode fingers configuring the comb-shaped electrode 13.

Figure 3:
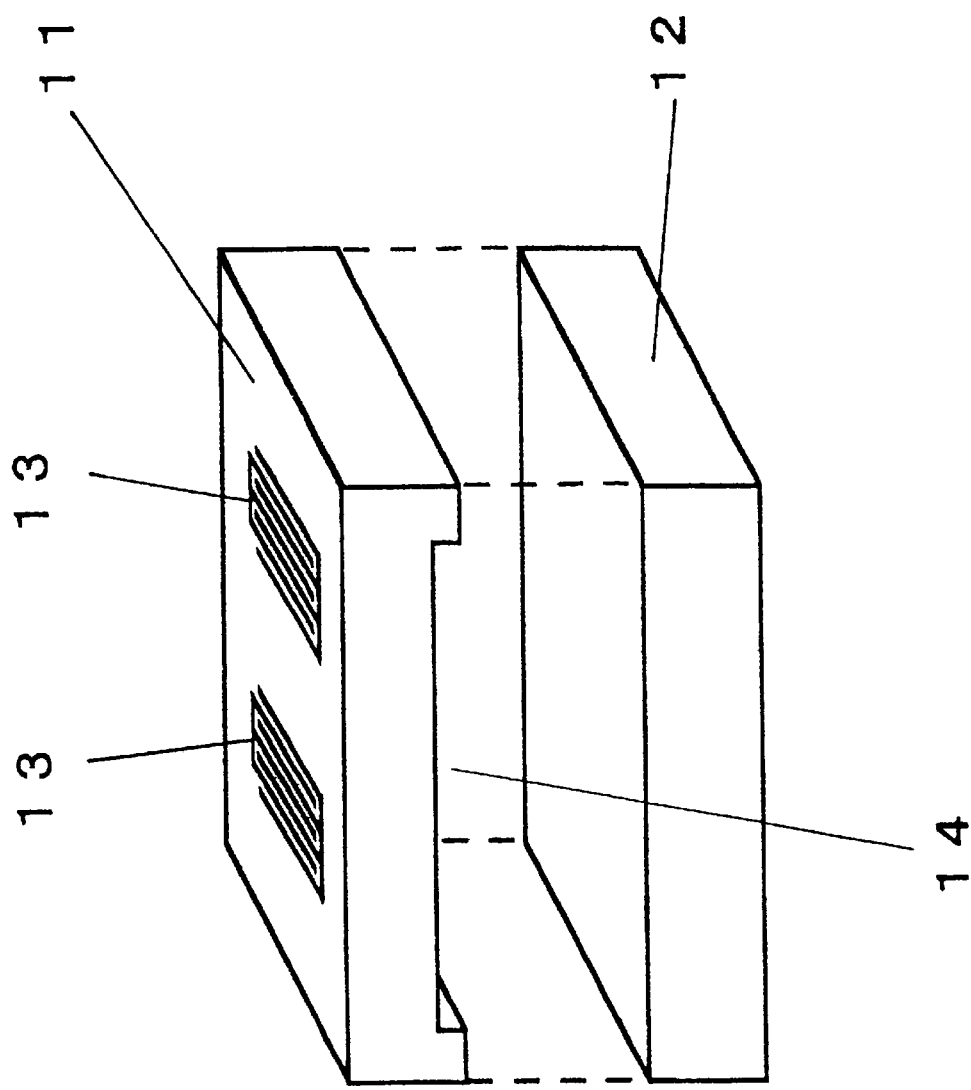
FIG. 3 is an exploded perspective view of the SAW element in the first embodiment of the present invention.

FIG. 3 is a perspective view showing the propagation substrate 11 and the auxiliary substrate 12 in an exploded fashion. In the SAW element in the present embodiment, the propagation substrate 11 and the auxiliary substrate 12 are brought into direct bonding to undergo lamination without using any adhesive agent.

Incidentally, in the SAW element in the present embodiment, the lithium tantalate substrate in 36° rotated Y cut X propagation with thickness of 100 μm is used as the propagation substrate 11, and the low thermal expansion glass substrate with thickness of 300 μm as the auxiliary substrate 12.

Next, operation of the present embodiment like this will be described. Application of alternative electric field to the comb-shaped electrode 13 causes the SAW to undergo excitation, and the SAW propagates along the surface of the propagation substrate 11. This SAW is converted into an electric signal again with the comb-shaped electrode 13. The above-described procedure will cause the device to function as a SAW element.

Incidentally, FIG. 1 and FIG. 2 show a basic configuration of the SAW element using the comb-shaped electrode 13, but in the case of using a filter or a resonance element, the number and configuration of the comb-shaped-electrode is changed in accordance with necessity.

Next, a compensation method for temperature characteristics of the SAW element of the present embodiment will be described. Firstly, the temperature characteristics will be described. The temperature coefficient of delay time (TCD) of the SAW element is one of the quantities that indicate temperature characteristics, and is approximately expressed by the difference between the thermal expansion coefficient α toward the propagating direction of the acoustic wave of the propagation substrate and the temperature coefficient of the SAW velocity (TCV). In addition, the TCV mainly depends on the temperature coefficient of the elastic constants of the propagation substrate and the temperature coefficient of the density of the propagation substrate, and for a substrate made of lithium niobate and lithium tantalate, etc. having a large electromechanical coupling coefficient, the TCV is a negative value.

Almost all the energy of SAW in the depth direction of the propagation substrate 11 is concentrated into approximately within a single wave length of the SAW wave length. Since thickness of the propagation substrate 11 in the present embodiment is not less than 10 times of the SAW wave length, the TCV is determined by the substrate constant (material constant) of the propagation substrate 11, and does not relate to the substrate constant (material constant) of the auxiliary substrate 12.

In the present embodiment, the thermal expansion coefficient in the propagating direction of the SAW on the propagating substrate 11 is larger than that on the auxiliary substrate 12.

Such propagation substrate 11 and auxiliary substrate 12 are brought into direct bonding. Consequently, for a positive change of temperature, compression stress influences the surface layer of the propagation substrate 11, and the extension of the propagation substrate 11 is suppressed more than in the case of a single body of the propagation substrate 11.

Therefore, density change in the propagation substrate 11 is suppressed, simultaneously giving rise to change in the elastic constants decrease in the elastic constants itself as well as decrease in the elastic constants temperature coefficient) due to the stress. Suppression on density changes contributes to increase the TCV, and the change in the elastic constants contributes to decrease in the TCV, but influence of the change in the elastic constants is larger, and consequently the TCV decreases more than in the case of a single unit of the propagation substrate. Finally, the thermal expansion coefficient in the propagating direction of the SAW will get smaller, and in addition, the TCD of the SAW element will be reduced.

As described above, compensation on temperature characteristics of the SAW element of the present embodiment is performed.

Subsequently, a manufacturing process of the SAW element in the present embodiment will be described.

The manufacturing process in the SAW element of the present embodiment is divided mainly into two processes, that is, formation of the groove 14 on the propagation substrate 11 and direct bonding.

Firstly, formation of the groove 14 on the propagation substrate 11 will be described.

After cleaning the propagation substrate 11, a resist mask is formed in the places other than the surface reserved for forming of the groove 14 of the propagation substrate 11. Next, the propagation substrate 11 on which a resist mask has been formed undergoes etching with a mixed liquid of fluoric acid and nitric acid. In the present embodiment, the propagation substrate 11 is made of lithium tantalate, and therefore, a mixed liquid of fluoric acid and nitric acid is used as the etching liquid, but an appropriate etching liquid should be used in accordance with the substrate material. After completion of the forming unit of the groove 14, the resist mask is removed.

Or otherwise, the groove 14 of the propagation substrate 11 may be formed as follows. The surfaces other than the one reserved for forming the groove 14 of the propagation substrate 11 have undergone mirror polishing. Using a dicing saw, the groove 14 is formed so as to have the section view of the groove 14 to get shaped as square or quasi-square. In the case where a wide groove 14 is formed, dicing blade is applied for a plurality of times to attain a desired groove width.

In addition, the groove 14 in the propagation substrate 11 may be formed as follows. Firstly, after the propagation substrate 1 is cleaned, a resist mask is formed on the surface other than the surface reserved for the groove 14 of the propagation substrate 11 to be formed. Next, the surface reserved for the groove 14 of the propagation substrate 11 to be formed, on which the resist mask has been formed, undergoes sand-blasting with blast abrasive grain. Finally, the resist mask is removed.

Incidentally, formation of the groove 14 of the propagation substrate 11 is not limited to the above-described method, but any method will do if it is to form the groove 14.

In addition, in the present embodiment, the sectional view of the groove 14 is shaped square or quasi-square, but V-shaped or other sectional shape will do.

Next, direct conbonding will be described.

Firstly, the surface of the propagation substrate 11 to undergo direct conjunction as well as the surface of the auxiliary substrate 12 where the groove 14 is formed are cleaned. Subsequently, the surface of the propagation substrate 11 and the surface of the auxiliary substrate 12 where the groove 14 is formed undergo hydrophilicity treatment. In particular, for example, the surface is dipped in ammonia-hydrogen peroxide so that hydroxyl group can be easily attached to the substrate surface which undergoes hydrophilicity. Next, sufficient cleaning is implemented with pure water. This will cause the hydroxyl group to be attached on the substrate surface.

When the substrates are laminated under this condition, the hydrogen bond of the hydroxyl group will take place mainly to cause the laminated substrates to absorb each other. This will cause the surface of the propagation substrate 11 as well as the surface of the auxiliary substrate 12 to undergo bonding on an atomic level, and the direct bonding configuration of the both substrates is realized. The aforementioned process is implemented under the room temperature.

Sufficient bonding intensity is attained without any additional arrangement, but in order to make the bonding intensity further concrete, thermal treatment of several ten minutes to several ten hours at a temperature of not less than 100° C. being remained under that absorption conditions will remove the component configuring water out of the bonding boundary. In the present embodiment, thermal treatment has been implemented for 10 hours at approximately 300° C.

This thermal treatment proceeds with bonding involving oxygen, hydrogen, and atoms configuring the substrate from bonding of hydrogen bonding nucleus by hydroxyl group, and bonding among atoms themselves configuring the substrate gradually starts so as to intensify the bonding. Especially, if there exist silicon, carbon, and oxygen, covalent bond is proceeded and bonding is intensified.

To the bonding substrate attained by the aforementioned process, photolythography is applied so that the comb-shaped electrode 13 is formed on the bonding substrate. In the present embodiment, the comb-shaped electrode 13 is disposed so that the comb-shaped electrode fingers and the groove 14 formed in the propagation substrate 11 are disposed in parallel. Finalizing the aforementioned process, the SAW element under the present embodiment is manufactured.

Subsequently, the groove 14 of the propagation substrate 11 of the SAW element of the present embodiment will be described. In the present embodiment, the groove 14 is formed in the course of the thermal treatment step of the substrate bonding so as to relieve stress influencing the bonding substrate and cause stress to uniformly influence over the SAW propagation region in the surface layer of the propagation substrate 14.

Here, stress relief is necessary to control fracturing to take place in the bonding substrate, and in addition, uniform influence of stress against the SAW propagation region in the surface layer of the propagation substrate 14 is necessary to attain good characteristic as a SAW element.

In order to relieve stress, scaling the subjection bonding area down will work well. This is due to that scaling down the substrate bonding area reduces thermal distortion of the bonding substrate, which is consequently relieved of the stress. Therefore, in the present embodiment, the groove 14 has been formed on the rear surface of the propagation substrate 11 as a method to scale down the substrate bonding area.

The degree of stress relief varies in accordance with the forming method for the groove 14, in other words, the forming direction as well as the size of the groove 14. For example, as concerns the forming direction, in the case where the groove 14 is formed perpendicular against the direction of SAW propagation, stress in the direction of SAW propagation is relieved.

On the other hand, when the groove 14 is formed in parallel along the SAW propagation- direction, stress in the direction perpendicular against the SAW propagation direction is relieved. In addition, intensity of stress is proportioned to difference in the thermal expansion coefficient between the propagation substrate 11 and the auxiliary substrate 12 in the direction of influencing stress, and thus, in the present embodiment, stress relief is implemented efficiently when the groove 14 is formed in perpendicular to the direction with larger difference of thermal expansion coefficient. However, when the groove 14 is formed perpendicular to the SAW propagation direction, the substrate bonding area will get smaller, and in some cases, sufficient bonding intensity will not become attainable.

For example, this case is exemplified by the case where the substrate sizes in the SAW propagation direction is not big compared with the region where the comb-shaped electrode 13 is formed. At this time, the temperature characteristics compensation effect becomes extremely small. In that case, the groove 14 may be formed in parallel to the SAW propagation direction.

In addition, as concerns the level of stress relief, deeper the groove 14 becomes, bigger stress relief becomes, and broader the width of the groove 14 becomes, bigger stress relief becomes. In the present embodiment, the depth of the groove 14 is set at an average of 30 $\mu$m and the width of the groove 14 at 400 $\mu$m, and the groove 14 is made deeper so as to implement further stress relief, and in addition the width of the groove 14 has been set at 400 $\mu$m, but the width of the groove 14 is made broader so as to implement further stress relief.

Also in order to cause stress to uniformly influence the SAW propagation region on the surface layer of the propagation substrate 11 under the condition with the groove 14 having been formed, it is important where to direct formation of the groove 14 and moreover how to dispose the forming position of the groove 14. In the present embodiment, piezoelectric material is used as the propagation substrate 11, but the piezoelectric material has anisotropy in the thermal expansion coefficient.

That is, within the surface of the propagation substrate 11, difference in the level of thermal expansion and contraction depends on directions. Therefore, in the case where the forming direction of the groove 14 is oblique against the SAW propagation direction, stress distribution occurs in the SAW propagation region on the surface layer of the propagation substrate 11, thus the propagation characteristics of the SAW propagating in this region, for example, the sonic velocity of the SAW will no longer become uniform, which is not preferable.

Accordingly, in order to cause stress to uniformly influence the SAW propagation region in the surface layer of the propagation substrate 11, it is necessary to form the groove 14 perpendicular to or in parallel along the direction of the SAW propagation. In addition, the groove 14 is preferably disposed for forming at least immediately under a region for the comb-shaped electrode 13 to be formed or immediately under a region for SAW propagation inclusive of the comb-shaped electrode 13 in order to cause stress to uniformly influence the groove 14.

This is due to that when the portion of the groove 14 and the bonding portion are brought into contact immediately under the SAW propagation region of the surface layer of the propagation substrate 11, stress in the region will become no longer uniform because of the difference of thermal distortion.

In order to confirm an effect of a SAW element of the present embodiment, a SAW element of the present embodiment and a conventional SAW element were produced and SAW propagation characteristics such as electromechanical coupling coefficient and the TCD were measured and compared. The conventional SAW element as an object for comparison has the same combination and sizes, etc. of substrate materials except that a groove is formed on the reverse surface of the propagation substrate 11 of the present embodiment.

Incidentally, in the present embodiment, 36° rotated Y cut X propagation lithium tantalate being an anisotropy material as a propagation substrate 11, and glass made from an isotropic material as an auxiliary substrate 12 are used, wherein the thermal expansion coefficient in the X direction being the SAW propagation direction of the propagation substrate 11 is 16 ppm/° C., and in addition, the thermal expansion coefficient of an auxiliary substrate 12 is 4 ppm/° C.

In the present embodiment, conditions for heat treatment of heat treatment step for substrate bonding are set at approximately 300° C. over 10 hours for the SAW element of the present embodiment as well as for the conventional SAW element, but in the case of the conventional SAW element, thermal stress to influence exceeds elastic limit of the propagation substrate 11 or the auxiliary substrate 12, giving rise to fracturing at a portion of the bonding substrate.

On the other hand, in the present embodiment, forming of the groove 14 in the propagation substrate 11 relieves stress influencing the bonding substrate, and thus, substrate fracturing in heat treatment step can be suppressed. Next, the SAW propagation characteristics are compared.

Incidentally, as concerns the TCD, frequency-temperature coefficient, which is the same absolute value with opposite sign as the TCD, is measured and then its opposite sign is removed to obtain the measurement value of the TCD. For both SAW elements, the electromechanical coupling coefficient is around 5% without showing any difference.

Figure 12:
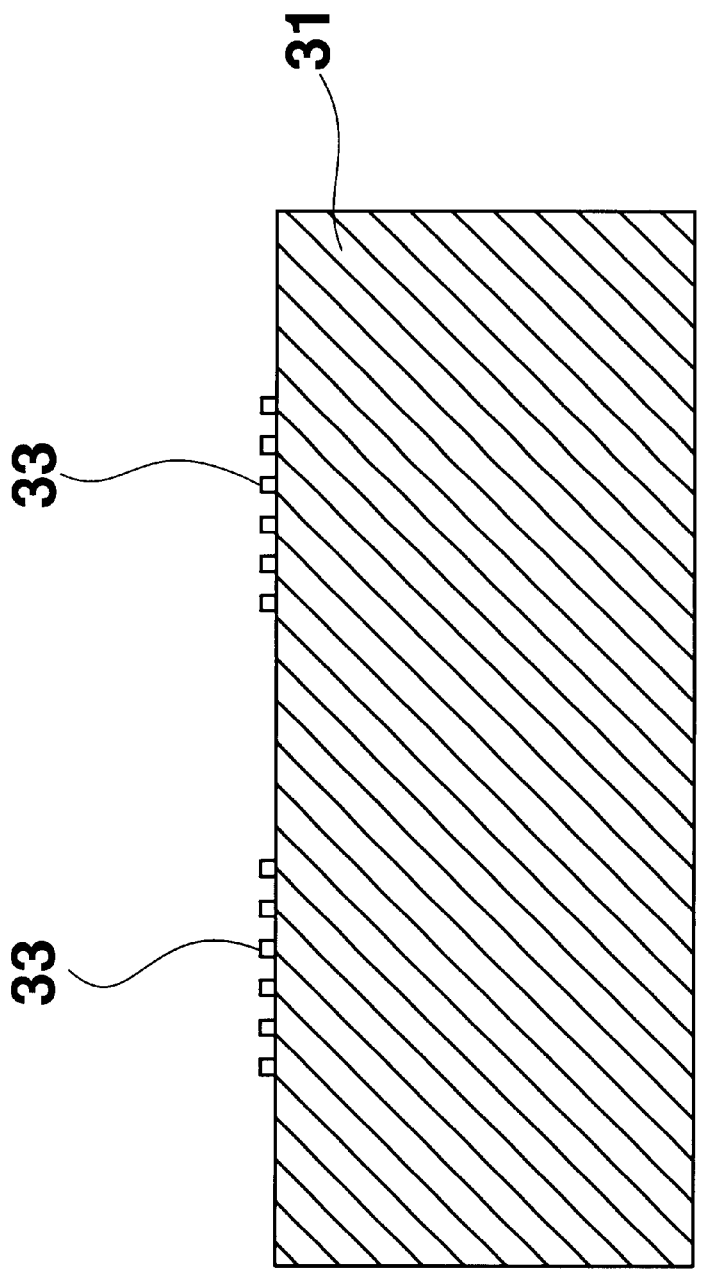
FIG. 12 is a sectional view of a SAW element using a conventional propagation substrate single unit.

On the other hand, as concerns the TCD, which is 25 ppm/° C. for the conventional SAW element, and which is 28 ppm/° C. for the SAW element of the present embodiment, an improvement is confirmed in comparison with the TCD (36 ppm/° C.) of a SAW element using single unit of a propagation substrate (36° rotated Y cut X propagation lithium tantalate). Incidentally, FIG. 12 shows a sectional view of a SAW element using that propagation substrate single unit.

In addition, in the embodiment of the present invention it is confirmed that frequency response does not vary either, nor SAW velocity varies. In addition, compared with a conventional SAW element, it is confirmed that dispersion of characteristics due to insufficient bonding is reduced so that a stable characteristics are obtained.

As mentioned so far, in the present embodiment, a SAW element, which suppresses fracturing of substrate during heat treatment step of substrate bonding, and in addition, has good temperature characteristics without changing various characteristics such as electromechanical coupling coefficient and SAW propagation velocity, can be obtained.

In the present embodiment, a propagation substrate 11 with a large thermal expansion coefficient in the propagation direction of SAW and an auxiliary substrate 12 with a small thermal expansion coefficient in the propagation direction of SAW are brought into direct contact for bonding so that in the surface layer of the propagation substrate 11 positive temperature change causes compression stress to influence to show a value smaller than a thermal expansion coefficient in the propagation direction of the original acoustic wave of the propagation substrate 11 to lessen density change.

In addition, in the present embodiment, stress influencing in the direction perpendicular to the direction of the SAW propagation is relieved in comparison with that in the conventional one. On the other hand, as concerns the direction in parallel to the direction of SAW propagation, since the propagation substrate 11 and the auxiliary substrate 12 are brought into direct contact for bonding, stress extends influence almost similar to that in a conventional one.

Incidentally, in the present embodiment, width of the groove 14 is set at 400 μm, but a wider groove 14 further relieves stress. In addition, depth of the groove 14 is set at an average of 20 μm, but a deeper groove 14 further relieves stress. In addition, in the present embodiment, the groove 14 is configured so that the sectional view thereof is shaped as square or quasi-square, but may be V-shaped or otherwise.

In addition, in the process of direct bonding, when foreign matters such as particles or dust exist on the surface of bonding, the portion where the foreign matters exist will not undergo bonding but give rise to a gap or bonding intensity will be extremely weakened, resulting in defective bonding. In the case where the substrates undergo direct bonding, possibility of defective bonding will be reduced as serial bonding area gets narrower, but by forming the groove 14, and dividing the bonding surface can reduce the serial bonding area so as to reduce the possibility of defective bonding.

In the present embodiment, substrates are not brought into bonding in the region immediately under the surface layer of the propagation substrate 11 where the SAW propagates, and thus no defective bonding takes place in this region. Therefore, no variation or deterioration in SAW propagation characteristics takes place.

In addition, in the present embodiment, 36° rotated Y cut X propagation lithium tantalate is used as the propagation substrate 11, but without being limited thereto, in the case where another crystallizing direction is used, a similar effect can be obtained by using a substrate with a thermal expansion coefficient in the SAW propagation direction of the auxiliary substrate 12 which is smaller than the thermal expansion coefficient in the acoustic wave propagation direction of the propagation substrate 11.

In addition, in the present embodiment, glass is used as the auxiliary substrate 12, but without being limited thereto, other low thermal expansion materials such as silicon may be used. In the case where glass is used as the auxiliary substrate 12, its amorphous nature will make bonding between the substrate 12 and the propagation substrate 11 made of single crystal easy. In addition, in the case of glass, materials having various mechanical features can be obtained by their compositions and control of temperature characteristics will become easy.

In addition, immediately under the SAW propagation region of the propagation substrate 11 of the present embodiment, there is no mirror surface bonding which a conventional SAW element has boundary surface between the propagation substrate 31 and the auxiliary substrate 32, moreover, at the time when the groove 14 is formed immediately under the SAW propagation region of the propagation substrate 11 will be situated into the same conditions as it substantially undergoes roughing processing, and therefore, further the groove 14 can suppress unnecessary spurious response in the frequency response of the SAW element due to reflection of bulk waves on the rear surface of the propagation substrate 11.

Moreover, in the present embodiment, the portion of the groove 14 is a cavity, but for example after the substrates are brought into bonding, the groove 14 may be filled with resin by using capillarity. The groove 14 being filled with resin, reflection of bulk waves on the rear surface of the propagation substrate 11 is further suppressed, and unnecessary spurious response can be suppressed further efficiently.

Figure 13:
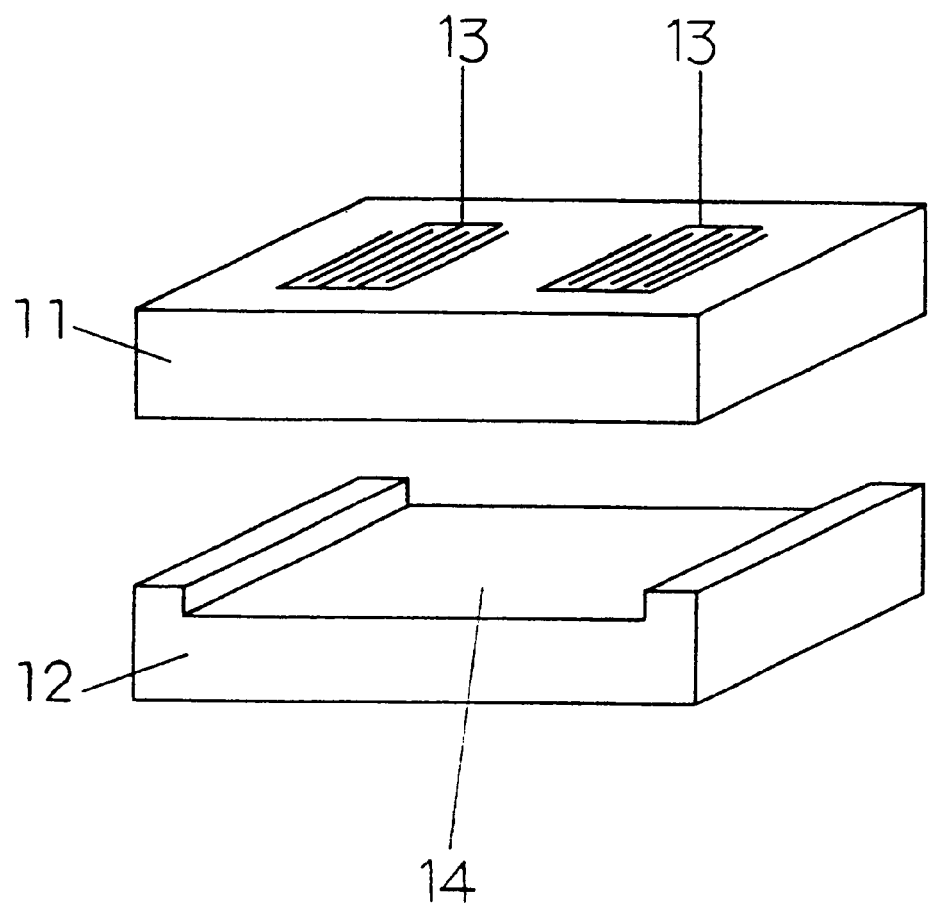
FIG. 13 is an exploded perspective view of the SAW element in another embodiment of the present invention.

In addition, in the present embodiment, the groove 14 is formed in the propagation substrate 11, but the effects described so far are to be essentially created by existence of the groove 14 in a substrate configuration of the present embodiment, and as shown in FIG. 13, by the groove 14 being formed in the auxiliary substrate 12, similar effects can be obtained. But, spurious response suppression effect can not be obtained.

(Second Embodiment)

Next, the second embodiment of the present invention will be described with reference to drawings. The present embodiment has a configuration similar to that of the SAW element in the above-described first embodiment with an exception of the groove 14 of the present invention. Accordingly, in the present embodiment, the parts which are basically similar to those in the first embodiment are numbered same, and description will be omitted. In addition, those lacking any particular description will be regarded as the same as in the first embodiment.

Figure 4:
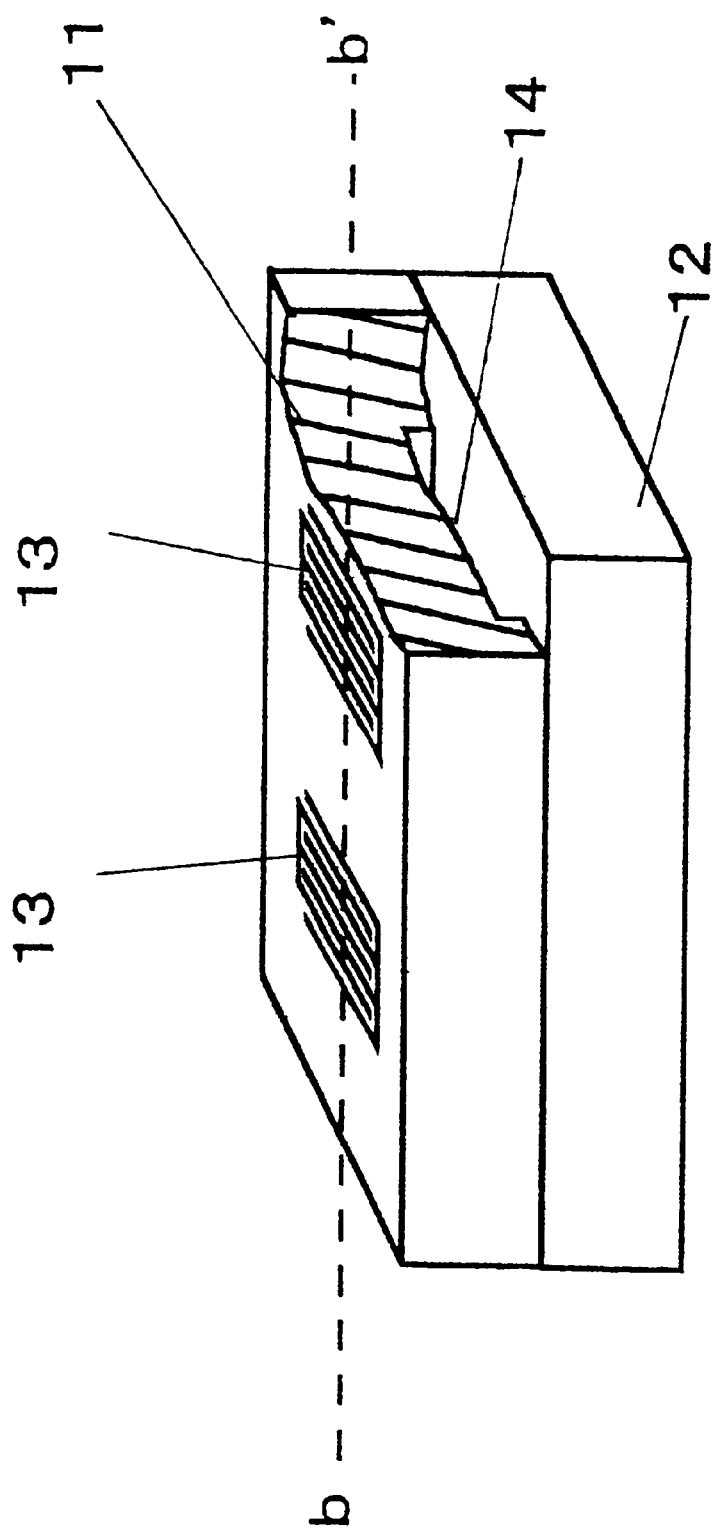
FIG. 4 is a partially broken perspective view of the SAW element in a second embodiment of the present invention.
Figure 5:
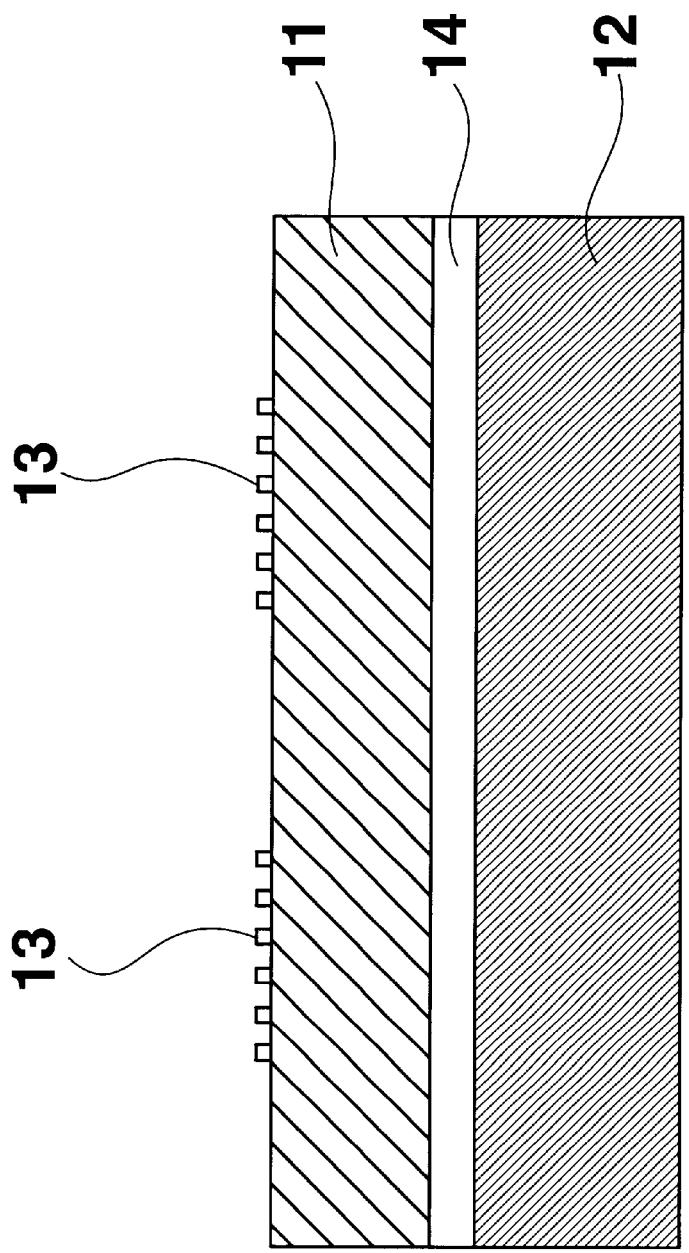
FIG. 5 is a sectional view along a line b—b' in FIG. 4.
Figure 6:
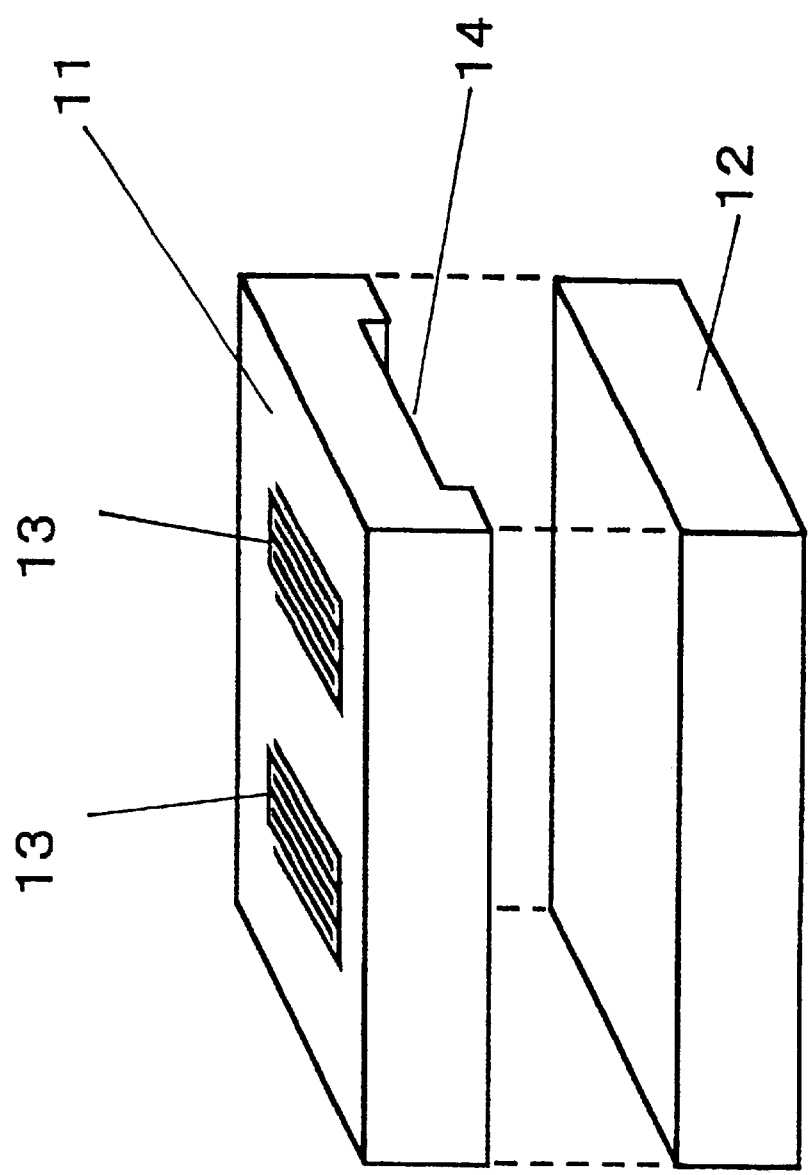
FIG. 6 is an exploded perspective view of the SAW element in the second embodiment of the present invention.

FIG. 4 is a partially broken perspective view of the SAW element in the second embodiment of the present invention, and FIG. 5 is a sectional view along a line b—b' in FIG. 4. FIG. 6 is a perspective view showing the propagation substrate 11 and the auxiliary substrate 12 in an exploded fashion. The SAW element shown in FIG. 4 through FIG. 6 is the same as the SAW element shown in FIG. 1 through FIG. 3 except for the configuration of the groove 14. The groove 14 of the SAW element in the present embodiment is formed on the auxiliary substrate 12 substantially perpendicular to comb electrode fingers configuring the comb-shaped electrode 13.

Subsequently a manufacturing process of the SAW element in the present embodiment will be described. A manufacturing process of the SAW element in the present embodiment is roughly divided into two processes of forming the groove 14 on the propagation substrate 11 and direct bonding.

At first, forming the groove 14 on the propagation substrate 11 will be described. After the propagation substrate 11 is cleaned, a resist mask is formed on the surface reserved for forming the groove 14 of the propagation substrate 11. Next, the propagation substrate 11 where the resist mask is formed undergoes etching with mixed liquid of fluoric acid and nitric acid.

In the present embodiment, since the propagation substrate 11 is lithium tantalate, mixed liquid of fluoric acid and nitric acid is used as etching liquid, but any appropriate etching liquid should be used in accordance with basic materials. After conclusion of the step for forming the groove 14, the resist mask is removed. In the present embodiment, the depth of the groove 14 is set at an average of 30 μm and the width of the groove 14 at 400 μm.

The groove 14 of the propagation substrate 11 may be formed as follows. The surfaces reserved for forming the groove 14 of the propagation substrate 11 have undergone mirror polishing. Using a dicing saw, the groove 14 is formed so as to have the section view of the groove 14 to get shaped as square or quasi-square so as to form a line. In the case where a wide groove 14 is formed, dicing blade is applied for a plurality of times to attain a desired groove width.

In addition, the groove 14 in the propagation substrate 11 may be formed as follows. Firstly, after the propagation substrate 11 is cleaned, a resist mask is formed on the surface reserved for forming the groove 14 of the propagation substrate 11. Next, the surface reserved for the groove 14 of the propagation substrate 11 to be formed of the resist mask undergoes sand-blasting with blast abrasive grain. Finally, the resist mask is removed.

As concerns substrate bonding, the propagation substrate 11 and the auxiliary substrate 12 are brought into direct bonding.

To the bonding substrate attained by the aforementioned process, photolythography is applied so that the comb-shaped electrode 13 is formed on the bonding substrate. In the present embodiment, the comb-shaped electrode 13 is disposed so that the comb-shaped electrode fingers and the groove 14 formed in the propagation substrate 12 create an angle of 0° (with the longitudinal direction of the comb-shaped electrode fingers coinciding with the major direction of the groove 14). Finalizing the aforementioned process, the SAW element under the present embodiment is manufactured.

In order to confirm an effect of a SAW element of the present embodiment, a SAW element of the present embodiment and a conventional SAW element were produced and SAW propagation characteristics such as electromechanical coupling coefficient and the TCD were measured and compared. The conventional SAW element as an object for comparison has the same combination and sizes, etc. of substrate materials except that a groove is formed on the rear surface of the propagation substrate 11 of the present embodiment.

Incidentally, in the present embodiment, X cut 112° Y propagation lithium tantalate being an anisotropy material as a propagation substrate 11, and glass made from an isotropic material as an auxiliary substrate 12 are used. The thermal expansion coefficient of the auxiliary substrate 12 is 4 ppm/° C., the thermal expansion coefficient of the propagation substrate 11 in the SAW propagation direction is 6 ppm/° C., and the thermal expansion coefficient in the direction perpendicular to the SAW propagation direction is 14 ppm/° C., and therefore, in order to obtain larger stress relief, the forming direction of the groove 14 is set in the SAW propagation direction.

In the present embodiment, conditions for heat treatment of heat treatment step for substrate bonding are set at approximately 200° C. over 10 hours for the SAW element of the present embodiment as well as for the conventional SAW element, but in the case of the conventional SAW element, thermal stress to influence the bonding substrate exceeds elastic limit of the propagation substrate 31 or the auxiliary substrate 32, giving rise to fracturing at a portion of the bonding substrate.

On the other hand, in the present embodiment, forming of the groove 14 in the propagation substrate 11 relieves stress influencing the bondings substrate, and thus, substrate fracturing in heat treatment step can be suppressed. Next, the SAW propagation characteristics are compared. Incidentally, as concerns the TCD, frequency-temperature coefficient, which is the same absolute value with opposite sign as the TCD, is measured and then its opposite sign is removed to obtain the measurement value of the TCD. For both SAW elements, the electromechanical coupling coefficient is around 0.7% without showing any difference.

On the other hand, as concerns the TCD, which is 11 ppm/° C. for the conventional SAW element, and which is 14 ppm/° C. for the SAW element of the present embodiment, an improvement is confirmed in comparison with the TCD (18 ppm/° C.) of a SAW element using single unit of a propagation substrate (X cut 112° Y propagation lithium tantalate). In addition, compared with a conventional SAW element, it is confirmed that dispersion of characteristics due to insufficient bonding is reduced so that stable characteristics are obtained. In addition, it is confirmed that frequency response does not vary either, nor SAW velocity varies.

As mentioned so far, in the present embodiment, a element, which suppresses fracturing of substrate during heat treatment step of substrate bonding, and in addition, has good temperature characteristics without changing various characteristics such as electromechanical coupling coefficient and SAW propagation velocity, can be obtained.

In the present embodiment, a propagation substrate 11 with a large thermal expansion coefficient in the propagation direction of SAW and an auxiliary substrate 12 with a small thermal expansion coefficient in the propagation direction of SAW are brought into direct contact for bonding so that in the vicinity of the surface of the propagation substrate positive temperature change causes compression stress to influence to show a value smaller than a thermal expansion coefficient in the propagation direction of the original SAW of the propagation substrate to lessen density change.

In addition, in the present embodiment, stress influencing in the direction parallel to the direction of the SAW propagation is relieved in comparison with that in the convention alone. On the other hand, as concerns the direction perpendicular to the direction of SAW propagation, since the propagation substrate 11 and the auxiliary substrate 12 are brought into direct contact for bonding, stress extends influence almost similar to that in a conventional one.

Incidentally, in the present embodiment, X cut 112° Y propagation lithium tantalate is used as the propagation substrate 11, but without being limited thereto, in the case where another crystallizing direction is used, a similar effect can be obtained by using a substrate with a thermal expansion coefficient in the propagation direction of the SAW of the auxiliary substrate 12 which is smaller than the thermal expansion coefficient in the acoustic wave propagation direction of the propagation substrate 11.

In addition, in the present embodiment, depth of the groove 14 is set at an average of 30 μm, but a deeper groove 14 further relieves stress. In addition, width of the groove 14 is set at 400 μm, but a wider groove 14 further relieves stress.

In the process of direct bonding, when foreign matters such as particles or dust exist on the surface of bonding, the portion where foreign matters exist will not undergo bonding but give rise to a gap or bonding intensity will be extremely weakened, resulting in defective bonding. In the case where the substrate undergo direct bonding, possibility of defective bonding will be reduced as serial bonding area gets narrower, but by forming the groove 14, and dividing the bonding surface can reduce the serial bonding area so as to reduce the possibility of defective bonding.

In the present embodiment, substrates are not brought into bonding in the region immediately under the surface layer of the propagation substrate 11 where the SAW propagates, and thus no defective bonding takes place in this region. Therefore, no variation or deterioration in SAW propagation characteristics takes place.

In addition, in the present embodiment, glass is used as the auxiliary substrate 12, but without being limited thereto, other low thermal expansion materials such as silicon may be used. In the case where glass is used as the auxiliary substrate 12, its amorphous nature will make bonding between the substrate 12 and the propagation substrate 11 made of single crystal easy.

In addition, in the case of glass, materials having various mechanical features can be obtained by their compositions and control of temperature characteristics will become easy.

In addition, immediately under the SAW propagation region of the propagation substrate 11 of the present embodiment, there is no mirror surface bonding which a conventional SAW element has boundary surface between the propagation substrate 31 and the auxiliary substrate 32, moreover, at the time when the groove 14 is formed, the place immediately under the SAW propagation region of the propagation substrate 11 will be situated into the same conditions as it substantially undergoes roughing processing and therefore, giving rise to an effect as well so that unnecessary spurious response in the frequency response of the SAW element due to reflection of bulk waves on the rear surface of the propagation substrate 11 can be suppressed.

Moreover, in the present embodiment, the portion of the groove 14 is a cavity, but for example after the substrates are brought into bonding, the groove 14 may be filled with resin by using capillarity. The groove 14 being filled with resin, reflection of bulk waves on the rear surface of the propagation substrate 11 is further suppressed, and unnecessary spurious response can be suppressed further efficiently.

Figure 14:
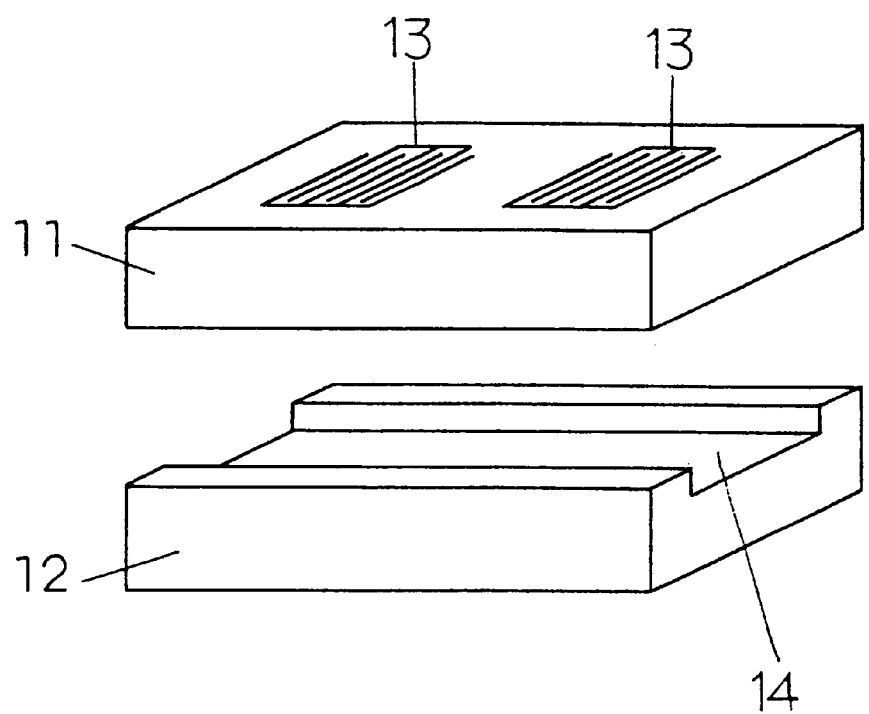
FIG. 14 is an exploded perspective view of the SAW element in another embodiment of the present invention.

In addition, in the present embodiment, the groove 14 is formed in the propagation substrate 11, but the effects described so far are to be essentially created by existence of the groove 14 in a substrate configuration of the present embodiment, and as shown in FIG. 14, by the groove 14 being formed in the auxiliary substrate 12, similar effects can be obtained.

(Third embodiment)

Next, the third embodiment of the present invention will be described with reference to drawings. The present embodiment has a configuration similar to that of the SAW element in the above-described first embodiment with an exception regarding the embodiment comprises a concave portion 15 of the present invention instead of the groove 14 of the present invention. Accordingly, in the present embodiment, the parts which are basically similar to those in the first embodiment are numbered same, and description will be omitted. In addition, those lacking any particular description will be regarded as the same as in the first embodiment.

Figure 7:
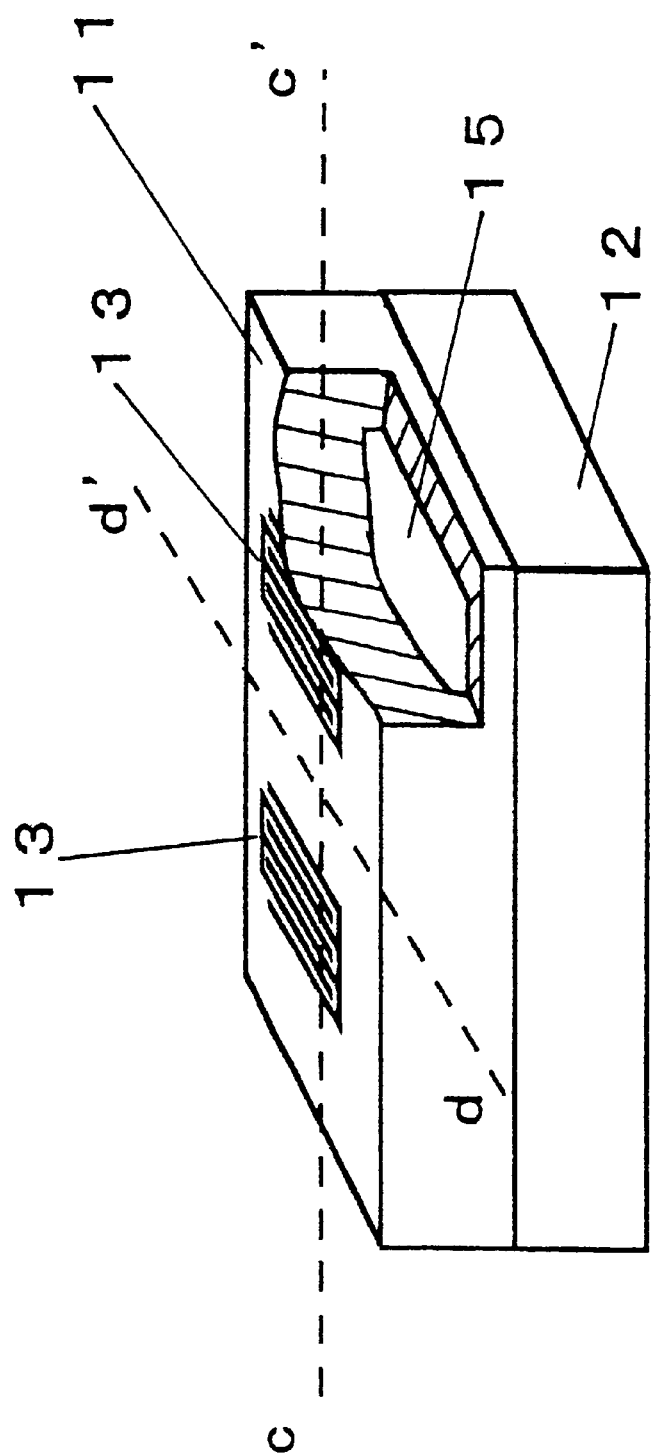
FIG. 7 is a partially broken perspective view of the SAW element in a third embodiment of the present invention.
Figure 8:
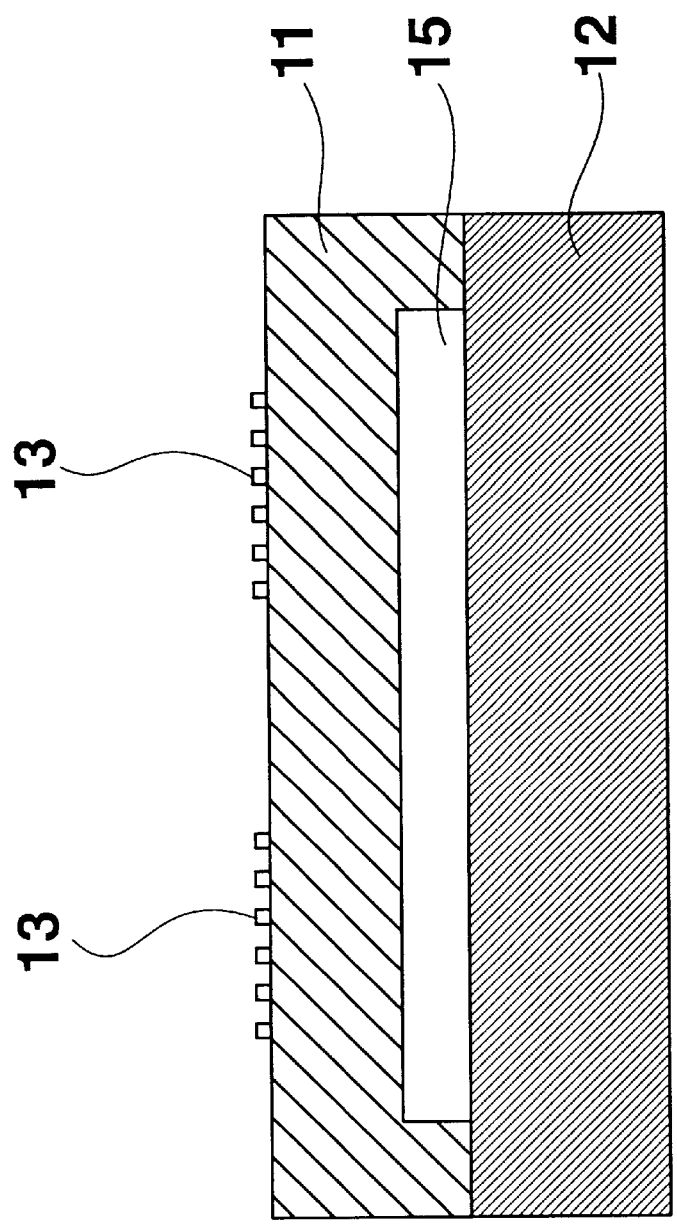
FIG. 8 is a sectional view along a line c—c' in FIG. 7.
Figure 9:
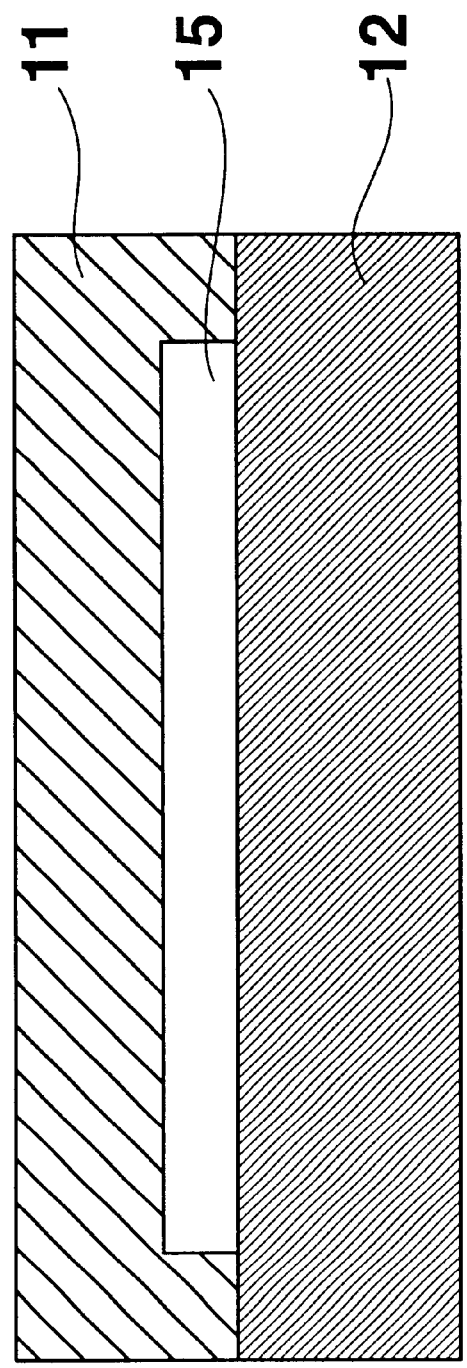
FIG. 9 is a sectional view along a line d—d' in FIG. 7.
Figure 10:
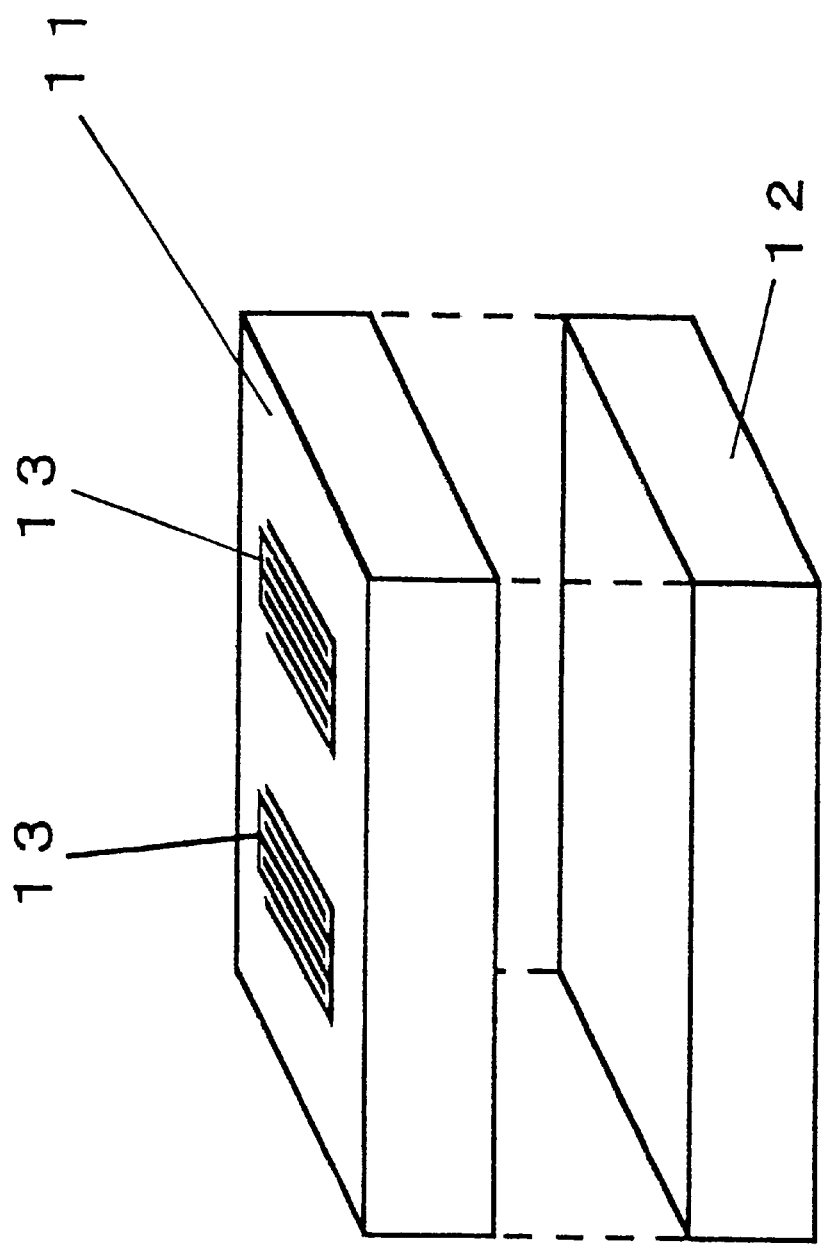
FIG. 10 is an exploded perspective view of the SAW element in the third embodiment of the present invention.

FIG. 7 is a partially broken perspective view of the SAW element in the third embodiment of the present invention, and FIG. 8 is a sectional view along a line c—c' in FIG. 7. In addition, FIG. 9 is a sectional view along a line d—d' in FIG. 7. FIG. 10 is a perspective view showing the propagation substrate 11 and the auxiliary substrate 12 in an exploded fashion.

The SAW element shown in FIG. 7 through FIG. 10 is the same as the SAW element shown in FIG. 1 though FIG. 3 except for lacking the groove 14 and comprising the concave portion 15 to be formed. The concave portion 15 of the SAW element in the present embodiment is formed on the auxiliary substrate 12 so that at least the position immediately under the comb-shaped electrode 13 is included.

Subsequently a manufacturing process of the SAW element in the present embodiment will be described. A manufacturing process of the SAW element in the present embodiment is roughly divided into two processes of forming the concave portion on the auxiliary substrate and direct bonding.

At first, forming the concave portion 15 on the propagation substrate 11 will be described. The surfaces reserved for forming the concave portion 15 of the propagation substrate 11 have undergone mirror polishing. After the propagation substrate 11 is cleaned, a resist mask is formed on the surface reserved for forming the concave portion 15 of the propagation substrate 11. Next, the propagation substrate 11 where the resist mask is formed undergoes etching with mixed liquid of fluoric acid and nitric acid.

In the present embodiment, since the propagation substrate 11 is lithium tantalate, mixed liquid of fluoric acid and nitric acid is used as etching liquid, but any appropriate etching liquid should be used in accordance with basic materials. After conclusion of the step for forming the concave portion 15, the resist mask is removed. The concave portion 15 of the propagation substrate 11 may be formed as follows. The surfaces reserved for forming the groove 14 of the propagation substrate 11 have undergone mirror polishing.

With respect to the concave portion 15, firstly, after the auxiliary substrate 12 is cleaned, a resist mask is formed on the surface reserved for forming the concave portion 15 of the propagation substrate 11. Next, the surface reserved for forming the concave portion 15 of the propagation substrate 11 where the resist mask is formed undergoes sand-blasting with blast abrasive grain. Finally, the resist mask is removed.

Incidentally, formation of the concave portion 15 of the propagation substrate 11 is not limited to the above-described method, but any method will do if it is to form the concave portion 15.

Concerning substrate bonding, as in the first embodiment the propagation substrate 11 and the auxiliary substrate 12 are brought into direct bonding.

To the bonding substrate obtained by the aforementioned process, photolythography is applied so that the comb-shaped electrode 13 is formed on the bonding substrate. In the present embodiment, the comb-shaped electrode 13 is disposed so as to come immediately above the concave portion 15. Through the aforementioned process, the SAW element under the present embodiment is manufactured.

Here, an effect of the concave portion 15 of the auxiliary substrate 12 in the present embodiment will be described. As in the first embodiment, forming the concave portion 15 reduces thermal distortion of the bonding substrate, because the substrate bonding area becomes smaller, consequently, the stress is relieved, and thus, substrate fracturing in heat treatment step on direct bonding can be suppressed.

In addition, in the process of direct bonding, when foreign matters such as particles or dust exist on the surface of bonding, the portion where foreign matters exist will not undergo bonding but give rise to a gap or bonding intensity will be extremely weakened, resulting in defective bonding. In the case where the substrate undergo direct bonding, possibility of defective bonding will be reduced as serial bonding area gets narrower, but, decreasing the contact-serial bonding area by forming the concave portion 15 can reduce the possibility of defective bonding.

In addition, in the present embodiment, stress influencing in the direction perpendicular to or parallel to the comb-shaped electrode fingers gets less intensive in comparison with that in a conventional SAW element. However, since no substrate bonding region exists immediately under the propagation region of surface acoustic wave, that is, the region where the comb-shaped electrodes are formed, no defective bonding in the propagation region of the SAW gives rise to stress which is heterogeneous.

In addition, forming the concave portion 15 makes it possible to obtain a SAW element in which homogeneous stress influence over the SAW propagation region on the surface layer of the propagation substrate 11.

In order to confirm an effect of a SAW element of the present embodiment, a SAW element in the present embodiment and a conventional SAW element were produced and SAW propagation characteristics such as electromechanical coupling coefficient and the TCD were measured and compared.

The conventional SAW element as an object for comparison has the same combination and sizes, etc. of substrate materials except that the concave portion 15 is formed on the reverse surface of the propagation substrate 11 of the SAW element of the present embodiment. Incidentally, in the present embodiment, 36° rotated Y cut X propagation lithium tantalate as a propagation substrate 11, and glass as an auxiliary substrate 12 are used.

In the present embodiment, conditions for heat treatment of heat treatment step for substrate bonding are set at approximately 200° C. over 10 hours for the SAW element of the present embodiment as well as for the conventional SAW element, but in the case of the conventional SAW element, thermal stress to influence the bonding substrate exceeds elastic limit of the propagation substrate 31 or the auxiliary substrate 32, giving rise to fracturing at a portion of the bonding substrate.

On the other hand, in the present embodiment, forming of the concave portion 15 on the propagation substrate 11 relieves stress influencing the bonding substrate, and thus, substrate fracturing in heat treatment step can be suppressed. Next, the SAW propagation characteristics are compared. Incidentally, as concerns the TCD, frequency-temperature coefficient, which is the same absolute value with opposite sign as the TCD, is measured and then its opposite sign is removed to obtain the measurement value of the TCD. For both SAW elements, the electromechanical coupling coefficient is around 5% without showing any difference.

Figure 11:
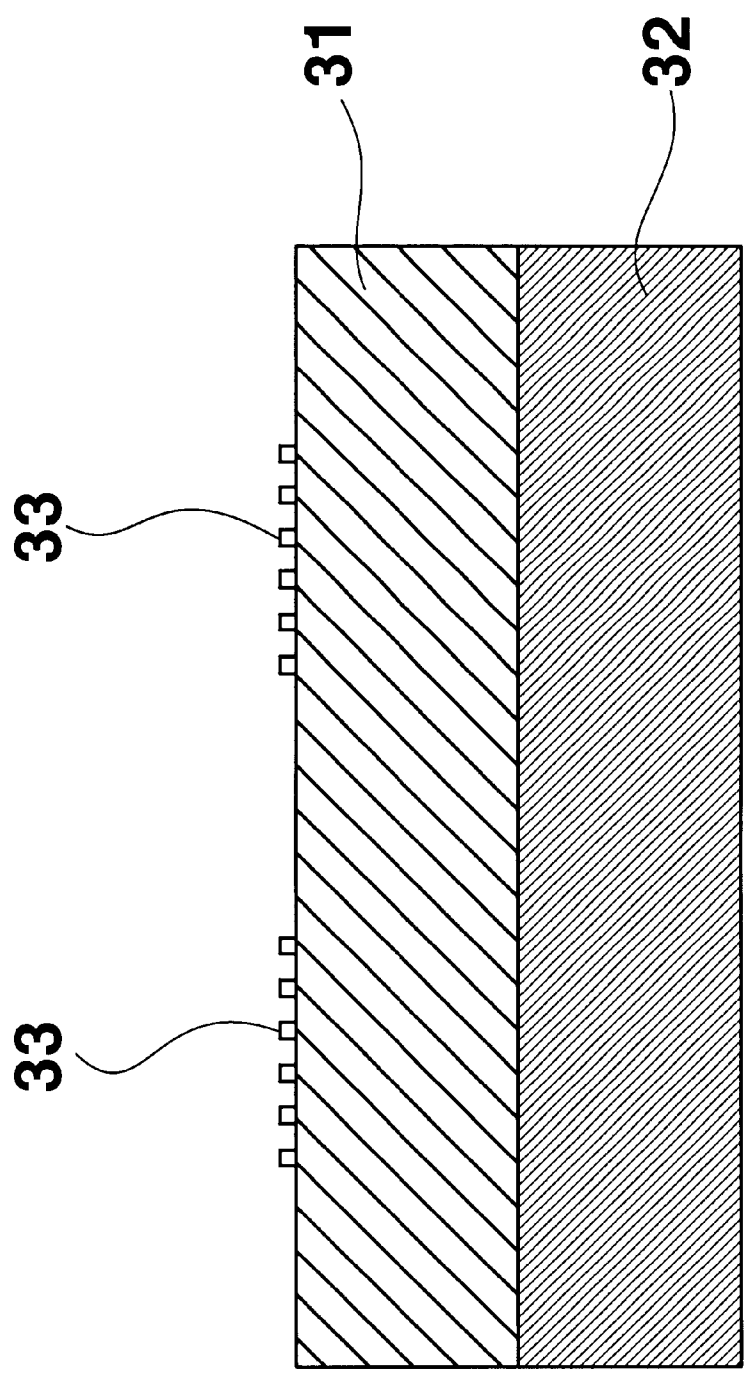
FIG. 11 is a sectional view showing a conventional SAW element.

On the other hand, as concerns the TCD, it is 25 ppm/° C. for the conventional SAW element, and is 30 ppm/° C. for the SAW element of the present embodiment. A degree of improvement in temperature characteristics gets smaller, but compared with the conventional SAW element shown in FIG. 11, dispersion in characteristics due to defective bonding is reduced, giving rise to an effect that stable characteristics are obtained.

In addition, compared with 36 ppm/° C. for the TCD for a SAW element using 36° rotated Y cut X propagation lithium tantalate single unit substrate, temperature characteristics in the SAW element in the present embodiment are improved. In addition, it is confirmed that frequency response does not vary either, nor SAW velocity varies.

As mentioned so far, in the present embodiment, a surface acoustic wave, which has good temperature characteristics without changing various characteristics such as electromechanical coupling coefficient and SAW propagation velocity, can be obtained.

In addition, in the present embodiment, a propagation substrate 11 with a large thermal expansion coefficient in the propagation direction of acoustic wave and an auxiliary substrate 12 with a small thermal expansion coefficient in the propagation direction of acoustic wave are brought into direct contact for bonding so that in the vicinity of the surface of the propagation substrate positive temperature change causes compression stress to influence to show a value smaller than a thermal expansion coefficient in the propagation direction of the original acoustic wave of the propagation substrate to lessen density change.

In addition, in the present embodiment, stress influencing in the direction parallel to as well as perpendicular to the direction of the SAW propagation is relieved in comparison with that in the conventional one.

Incidentally, in the present embodiment, the size of the region of the concave portion 15 is set at 800 μm×400 μm, and the depth of the concave portion is set at an average of 20 μm.

The width of the groove 14 is set at 400 μm, but the size as well as the depth of the region of the concave portion 15 may be changed so that a degree in stress relief can be changed.

In addition, in the present embodiment, 36° rotated Y cut X propagation lithium tantalate is used as the propagation substrate 11, but without being limited thereto, in the case where another crystallizing direction is used, a similar effect can be obtained by using a substrate with a thermal expansion coefficient in the propagation direction of the acoustic wave of the auxiliary substrate 12 which is smaller than the thermal expansion coefficient in the acoustic wave propagation direction of the propagation substrate 11.

In addition, in the present embodiment, glass is used as the auxiliary substrate, but without being limited thereto, other low thermal expansion materials such as silicon may be used. In the case where glass is used as the auxiliary substrate, its amorphous-nature will make bonding with the propagation substrate made of single crystal easy. In addition, in the case of glass, materials having various mechanical features can be obtained by their compositions and control of temperature characteristics will become easy.

In addition, immediately under the SAW propagation region of the propagation substrate 11 of the present embodiment, there is no mirror surface bonding which a conventional SAW element has boundary surface between the propagation substrate 31 and the auxiliary substrate 32, moreover, at the time when the concave portion 15 is formed the place immediately under the SAW propagation region of, the propagation substrate 11 will be situated into the same conditions as it substantially undergoes roughing processing, and therefore, giving rise to an effect as well so that unnecessary spurious response in the frequency response of the SAW element due to reflection of bulk waves on the rear surface of the propagation substrate 11 can be suppressed.

Figure 15:
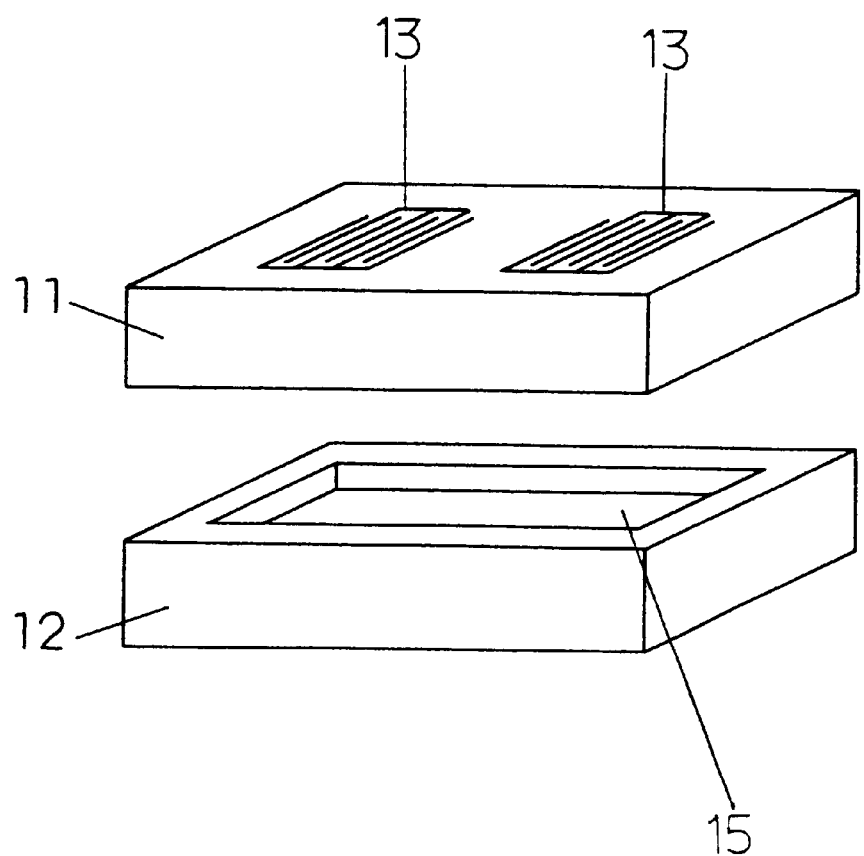
FIG. 15 is an exploded perspective view of the SAW element in another embodiment of the present invention.

In addition, in the present embodiment, the concave portion 15 is formed in the propagation substrate 11, but the effects described so far are to be essentially created by existence of the concave portion 15 in a substrate configuration of the present embodiment, and as shown in FIG. 15, by the concave portion 15 being formed in the auxiliary substrate 12, similar effects can be obtained.

In addition, mobile communication apparatus of the present invention such as portable telephone is characterized by the SAW element of the present invention being used as a filter or a resonator. The mobile communication apparatus of the present invention comprises configuring elements other than those filter or resonator, for example, antenna, transmitting signal processing circuit, and receiving signal processing circuit, etc., which are widely known and naturally needed for respective mobile communication apparatuses.

Incidentally, shapes of non-bonding regions in the propagation substrate and the auxiliary substrate of the present invention include other optional shapes such as curved grooves, concave portions with different depths, and polygonal figures without being limited to the above-described grooves and concave portions.

In addition, shapes of bonding regions in the propagation substrate and the auxiliary substrate of the present invention include other optional shapes such as partially disconnected circle loop, and pin point shape in addition to the above-described belt shape and circle loop.

In addition, bonding regions of the present invention are not required to be disposed at an extreme edges of substrates, but may be of course moved a little inward for disposition.

As apparent from the above description, the present invention can provide a SAW element which suppresses dispersion in propagation characteristics of the SAW and has good temperature characteristics.

What is claimed is:

1. A SAW element comprising:
   a propagation substrate being a piezoelectric substrate;
   an auxiliary substrate which is laminated on said propagation substrate by way of direct bonding; and
   a comb-shaped electrode to be formed on a surface of said propagation substrate, the surface of which is the opposite side to the bonding surface with said auxiliary substrate and to excite an the acoustic wave,
   wherein:
   said propagation substrate and said auxiliary substrate are not brought into bonding each other at least in a region immediately below a region where said comb-shaped electrode is formed; and
   a thermal expansion coefficient in a propagation direction of said acoustic wave of said auxiliary substrate is smaller than a thermal expansion coefficient in a propagation direction of said acoustic wave of said propagation substrate.

2. The SAW element according to claim 1, wherein a concave portion or a groove is formed on said propagation substrate, and existence of said concave portion or groove forms a region where said propagation substrate and said auxiliary substrate are not brought into bonding.

3. The SAW element according to claim 1, wherein a concave portion or a groove is formed on in said auxiliary substrate, and existence of said concave portion or groove forms a region where said propagation substrate and said auxiliary substrate are not brought into bonding.

4. The SAW element according to claim 1, 2, or 3, wherein a region where said propagation substrate and said auxiliary substrate are brought into bonding exists covers all of the circumference of said propagation substrate.

5. The SAW element according to claim 1, wherein said propagation substrate and said auxiliary substrate are substantially rectangular-shaped, and a region where said substrates are brought into bonding each other exists on two lines of any pair of lines facing each other of said propagation substrate.

6. The SAW element according to claim 5, wherein said two lines of any pair of lines facing each other are such two lines of a pair in two pairs each having two lines, that receive stress more homogeneously in a surface substantially perpendicular to the propagation direction of said acoustic wave.

7. The SAW element according to claim 2 or 3, wherein said grooves are formed in parallel to a direction of fingers of said comb-shaped electrode.

8. The SAW element according to claim 2 or 3, wherein the thermal expansion coefficient of said propagation substrate has anisotropy, and said grooves are formed in a direction substantially perpendicular to the direction having larger thermal expansion coefficient of said propagation substrate.

9. The SAW element according to any of claims 1, 2, 3, 5 or 6, wherein said direct bonding is obtained by flattening, mirror-polishing, cleaning and hydrophilic-performing the respective surfaces of said propagation substrate and said auxiliary substrate and overlapping, the substrates and thereafter making said bonding with thermal processing.

10. A mobile communication apparatus comprising a SAW element according to any one of claims 1, 2, 3, 5 or 6, an antenna, a transmitting signal processing circuit, and a receiving signal processing circuit, wherein:

said SAW element is used as a filter or a resonator.

\* \* \* \* \*